US00RE44712E

(19) United States
(12) Reissued Patent
Ranish et al.

(10) Patent Number: US RE44,712 E
(45) Date of Reissued Patent: Jan. 21, 2014

(54) LAMP FOR RAPID THERMAL PROCESSING CHAMBER

(75) Inventors: Joseph M. Ranish, San Jose, CA (US); Khurshed Sorabji, San Jose, CA (US)

(73) Assignee: Applied Materials, Inc., Santa Clara, CA (US)

(21) Appl. No.: 13/288,586

(22) Filed: Nov. 3, 2011

Related U.S. Patent Documents

Reissue of:
(64) Patent No.: 7,612,491
Issued: Nov. 3, 2009
Appl. No.: 11/675,145
Filed: Feb. 15, 2007

(51) Int. Cl.
*H01J 5/48* (2006.01)

(52) U.S. Cl.
USPC ..... 313/318.08; 219/405; 219/411; 438/14

(58) Field of Classification Search
USPC ..... 313/46; 362/264; 219/411
See application file for complete search history.

(56) References Cited

U.S. PATENT DOCUMENTS

| | | | | |
|---|---|---|---|---|
| 4,322,658 | A * | 3/1982 | Minarczyk | 315/47 |
| 4,360,862 | A * | 11/1982 | Strasser et al. | 362/477 |
| 4,496,874 | A * | 1/1985 | Sanders et al. | 313/318.09 |
| 4,567,397 | A * | 1/1986 | Wilhelm et al. | 313/318.07 |
| 4,647,137 | A * | 3/1987 | Sorrell | 439/611 |
| 4,683,523 | A * | 7/1987 | Olsson et al. | 362/477 |
| 4,791,290 | A * | 12/1988 | Noone et al. | 250/239 |
| 5,245,246 | A * | 9/1993 | Boland et al. | 313/15 |
| 5,506,761 | A * | 4/1996 | Strauss | 362/267 |
| 5,754,055 | A | 5/1998 | McAdoo et al. | |
| 6,072,160 | A * | 6/2000 | Bahl | 219/405 |
| 6,286,206 | B1 * | 9/2001 | Li | 29/840 |
| 6,359,376 | B1 * | 3/2002 | Hollstein et al. | 313/46 |
| 6,393,209 | B2 | 5/2002 | Kimura | |
| 6,707,011 | B2 * | 3/2004 | Tay et al. | 219/411 |
| 6,744,187 | B1 | 6/2004 | Wimberly | |
| 6,805,466 | B1 | 10/2004 | Ranish | |
| 7,147,359 | B2 | 12/2006 | Ranish et al. | |
| 7,314,290 | B2 * | 1/2008 | Saieva | 362/264 |
| 2001/0014021 | A1 | 8/2001 | Duff et al. | |
| 2002/0003708 | A1 * | 1/2002 | Roller et al. | 362/521 |
| 2005/0286243 | A1 * | 12/2005 | Ranish et al. | 362/89 |
| 2006/0066193 | A1 | 3/2006 | Ranish | |
| 2006/0086713 | A1 * | 4/2006 | Hunter et al. | 219/411 |
| 2007/0001576 | A1 * | 1/2007 | Benedix et al. | 313/317 |
| 2008/0074057 | A1 * | 3/2008 | Pawelek et al. | 315/291 |

FOREIGN PATENT DOCUMENTS

| | | |
|---|---|---|
| JP | 6005266 | 1/1994 |
| JP | 11116899 | 4/1999 |
| WO | WO02/03418 | 1/2002 |

* cited by examiner

*Primary Examiner* — Mary Ellen Bowman
(74) *Attorney, Agent, or Firm* — Servilla Whitney LLC

(57) ABSTRACT

A lamp assembly adapted for use in a substrate thermal processing chamber to heat the substrate to temperatures up to at least about 1100° C. is disclosed. In one embodiment, the lamp assembly comprises a bulb enclosing at least one radiation generating filament attached to a pair of leads, a lamp base configured to receive the pair of leads, a sleeve having a wall thickness of at least about 0.013 inches and a potting compound having a thermal conductivity greater than about 100 W/(K-m).

30 Claims, 2 Drawing Sheets

LAMP FOR RAPID THERMAL PROCESSING CHAMBER

Matter enclosed in heavy brackets [ ] appears in the original patent but forms no part of this reissue specification; matter printed in italics indicates the additions made by reissue.

BACKGROUND

Embodiments of the present invention generally relate to semiconductor processing systems and, more specifically, lamps for advanced heating in a semiconductor processing system.

Rapid thermal processing (RTP) systems are employed in semiconductor chip fabrication to create, chemically alter or etch surface structures on semiconductor substrates or wafers. RTP typically depends upon an array of high-intensity incandescent lamps fit into a lamphead and directed at the substrate or wafer. The lamps are electrically powered and can be very quickly turned off and on and a substantial fraction of their radiation can be directed to the substrate. As a result, the wafer can be very quickly heated without substantially heating the chamber and can be nearly as quickly cooled once the power is removed from the lamps.

An example of a RTP system is described in U.S. Pat. No. 5,155,336, which is assigned to the assignee of the present application and which is incorporated herein by reference, and includes a semiconductor processing chamber and a heat source assembly or lamphead located on the semiconductor processing chamber. A number of tungsten-halogen lamps are located in the lamphead, and the lamps are capable of heating substrates in the chamber at a rate of about 300° C./sec to temperatures as high as 1200° C. and higher. During processing, infrared radiation from the lamps radiates through an upper window, light passageways and a lower window onto a rotating semiconductor substrate in the processing chamber. In this manner, the wafer is heated to a required processing temperature.

As shown in FIG. 1, a conventional halogen lamp 10 (also referred to as a tungsten-halogen lamp) for use in semiconductor processing includes a bulb 12 (also referred to an envelope) that has a radiation generating filament in the form of a coil 14 electrically coupled between a short inner lead 16 and a long inner lead 18. Inner leads 16 and 18 are coupled to outer leads 26 by foils 22. The foils 22 are commonly made from molybdenum. The inner leads, outer leads, and foils are held in place at a lamp base 20. The lamp base is pressed together during manufacturing over the foil area to form a press seal that hermetically seals the lamp bulb. The bulb 12 is commonly made of quartz and is typically filled with a halogen containing gas.

During semiconductor processing operations, such lamps are placed in a patterned array in a processing chamber to heat a substrate placed in the chamber. The lamps operate at extremely high temperatures as noted above. Typically, about half of the radiant energy from the lamp goes out of the end of the associated light pipe after many reflections. About half of the radiant energy from the lamp is absorbed at the base 20 of the lamp and in the reflector/lamphead structure. This can cause the base of the lamp to reach much higher temperatures as compared to a lamp radiating in open space. If the base gets too hot, the average lamp lifetime can be substantially reduced. This lamp degradation is caused by rupture in the seal around the foils 22, which carry the electrical energy to the filament. Above about 300° C., the foils, which are usually made from molybdenum, are easily oxidized and the resulting molybdenum oxide causes a volume expansion which ruptures the quartz or causes an open circuit. Thus, it is necessary to provide a means for cooling the lamp base 20.

In addition, elaborate structures have been designed to conduct heat away from the lamp base 20. According to conventional methods, the lamp base 20 is encapsulated within the precision outer diameter stainless steel tube using a porous potting compound. This high precision stainless steel tube is inserted into another high precision stainless steel tube which has its outer surface (for most of its length) water cooled. A reflector sleeve which surrounds a portion of the bulb is provided to reflect radiant energy away from the bulb. This elaborate cooling mechanism causes the lamp to operate at a temperature low enough to permit long lamp life.

Another approach used to conduct heat away from the lamp is to dispose a heat shield or reflector plate within the lamp bulb between the lamp filament or coil and the lamp base. Examples of lamp bulbs that include a heat shield or internal reflector plate are disclosed in PCT International Publication No. WO02/03418 and U.S. Pat. No. 6,744,187. While lamp bulbs having a heat shield or reflector plate within the bulb may be effective, these approaches require an additional part to be added to the bulb assembly.

Despite the lamp cooling approaches discussed above, it would be desirable to provide additional ways to improve heat dissipation away from the lamp, lamp base, and lamphead/reflector sleeve.

SUMMARY OF THE INVENTION

One embodiment of the present invention relates to a lamp assembly comprising: a bulb enclosing at least one radiation generating filament attached to a pair of leads, the bulb having an inner surface an outer surface; a lamp base configured to receive the pair of leads; a metal sleeve surrounding the lamp base and filled with a potting compound, the sleeve having a wall thickness of at least about 0.020 inches and the potting compound having a thermal conductivity exceeding about 100 W/(K-m), the lamp assembly adapted for use in a substrate processing chamber to heat the substrate to temperatures up to at least about 1100° C. According to one or more embodiments, the potting compound has a thermal conductivity exceeding about 150 W/(K-m), for example greater than about 200 W/(K-m).

In one or more embodiments, the wall thickness of the sleeve exceeds about 0.040 inches, for example, exceeding about 0.050 inches. The sleeve can be made from copper or aluminum. According to one or more embodiments, the potting compound comprises magnesium phosphate bonded aluminum nitride. In one embodiment, the potting compound comprises an epoxy based potting compound, which may further include copper or silver.

According to one or more embodiments, the cross-sectional shape of the sleeve substantially conforms to the cross-sectional shape of the lamp base. In one embodiment, the cross-sectional shape of the sleeve is substantially rectangular.

In another embodiment, a lamp assembly is provided which comprises a bulb enclosing at least one radiation generating filament attached to a pair of leads, the bulb having an inner surface an outer surface; a lamp base configured to receive the pair of leads; and a first potting compound having a thermal conductivity exceeding about 100 W/(K-m) surrounding the base, the lamp assembly adapted for use in a substrate processing chamber to heat the substrate to temperatures up to at least about 1100° C. In an embodiment, the thermal conductivity of the potting compound exceeds about 150 W/(K-m), and it may exceed about 200 W/(K-m).

In one embodiment, the lamp assembly may comprise a second potting compound located adjacent the bulb, the second potting compound having a lower thermal conductivity and a higher reflectivity than the first potting compound. In certain embodiments, the first potting compound comprises an epoxy based aluminum nitride compound and the second potting compound comprises a zirconia based potting compound. According to one embodiment, the second potting compound is present in a layer having a thickness of less than about 1 mm.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

DETAILED DESCRIPTION

In the following description, specific details are set forth in order to provide a thorough understanding of the invention. It will be appreciated, however, by one skilled in the art, that the invention may be practiced without these specific details. In other instances, well-known elements have not been shown in order to avoid unnecessarily obscuring the invention.

Embodiments of the invention generally provide a lamp assembly adapted for use in a substrate thermal processing chamber to heat the substrate to temperatures up to at least about 1100° C., for example, up to about 1350° C. According to one or more embodiments, the lamp assembly, which can be used in a rapid thermal processing apparatus used for use in semiconductor substrate processing, is designed to flow heat away down the length of the tube surrounding and out through the potting compound to cool the bulb more rapidly than in presently existing bulbs. According to embodiments of the invention, it is expected that lamp life will be extended, and premature lamp failures will be prevented due to excessive heating of the lamp bulb and lamp base.

According to embodiments of the invention, increasing the thermal conductivity of the tube or sleeve surrounding the lamp assembly and/or increasing the thickness of the tube or sleeve aids in conducting heat away from the lamp bulb. In presently existing lamp assemblies, the sleeve surrounding the lamp assembly is typically made from stainless steel. According to one or more embodiments, copper or aluminum is utilized for the sleeve surrounding the lamp assembly to increase the thermal conductivity of the sleeve over the conventional lamp assembly. In another embodiment, a higher thermal conductivity potting compound may be utilized to aid in conducting heat away from the lamp bulb and base. In presently existing lamp assemblies, the potting compound used in presently existing lamp assemblies has a thermal conductivity of about 1-2 W/(K-m). According to embodiments of the invention, the potting compounds having a thermal conductivity exceeding about 100 W/(m-k), for example exceeding 150 W/(m-K), and more particularly exceeding 200 W/(m-K) are utilized in the lamp assembly. By increasing the thermal conductivity of the sleeve alone or in combination with increasing the thickness of the sleeve and increasing the thermal conductivity of the potting compound, greatly facilitates transfer of heat away from the lamp bulb and lamp base to the cooling fluid flowing the through the stainless steel housing surrounding the plurality of lamp assemblies.

Figure 1:
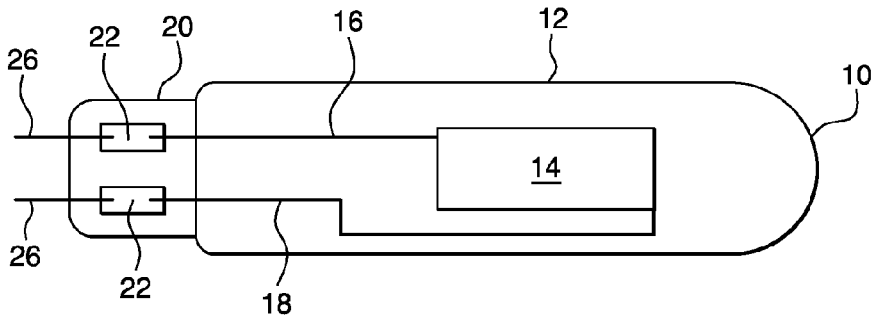
FIG. 1 (Prior Art)
FIG. 1 shows a prior art conventional halogen lamp for use in semiconductor processing.
Figure 2:
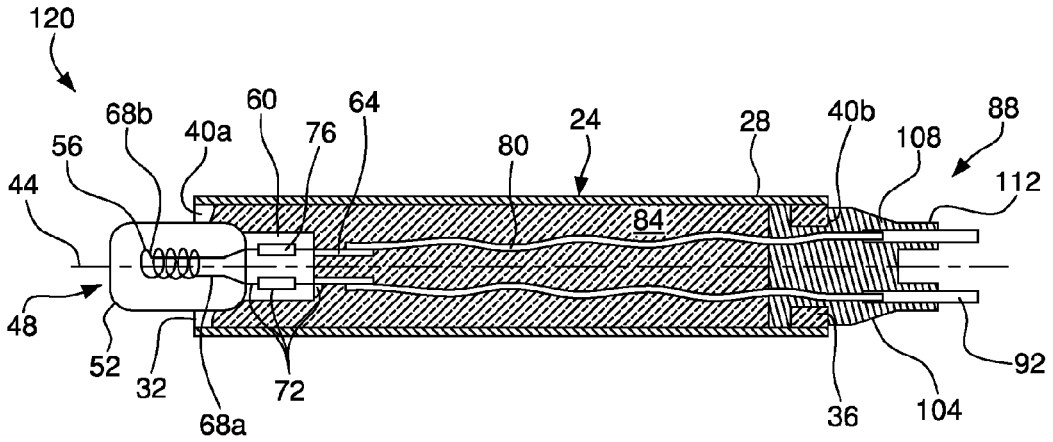
FIG. 2 shows a cross-sectional view lamp assembly according to an embodiment of the invention.

Referring now to FIG. 2, an embodiment of a lamp assembly 120 that may be used to supply heat energy to process substrates in a substrate processing chamber is shown. This and other embodiments of the lamp assembly 120 described herein are only illustrative examples, however, and should not be used to limit the scope of the invention.

In one embodiment, the lamp assembly 120 comprises a sleeve or body 24 which provides a structural basis to contain the lamp assembly 120 and transfer heat out of the assembly 120. The sleeve or body 24 comprises containing walls 28 and first and second ends 32, 36. The containing walls 28 have openings 40 a,b at the first and second ends 32, 36. In one embodiment, the containing walls 28 comprise a metal that facilitates heat transfer and provides a reflective surface. For example, the sleeve 24 may comprise stainless steel, which may be brushed or polished to be reflective. Thermal modeling has shown that a more conductive sleeve material such as copper or aluminum further improves heat transfer and reduces the heat adjacent the bulb. Furthermore, increasing the wall thickness of the sleeve without increasing the overall outer diameter of the tube further improves transfer of heat away from the bulb. In a non-limiting example the outer diameter of the sleeve a bulb used in a RTP chamber may be about 0.619 inches in outer diameter and about 0.592 inches in inner diameter, resulting in a wall thickness of the sleeve of about 0.013 inches. Thermal modeling has shown that increasing the wall thickness of the tube to greater than about 0.020 inches, particularly, greater than about 0.040 inches, and more particularly greater than about 0.050 inches greatly improves the flow of heat away from the bulb and reduces the temperature of the bulb. A thermal model was utilized to determine the effect on temperature on changing the sleeve material, the potting compound thermal conductivity and the thickness of the sleeve. The temperature at several locations in an RTP chamber were analyzed. It was determined that utilizing a higher conductivity sleeve material in combination with an increased sleeve thickness and/or a higher conductivity potting compound would reduce the temperature at certain locations within and adjacent the lamp tube by 75° C. to about 100° C. In one embodiment, the tube is comprised of a high conductivity metal and has little or no potting compound contained within the shell of the tube. In this embodiment the tube would be substantially a solid with conduits provided for wires and in some cases bulb and plug inserted into opposite ends of the tube. In earlier generations of RTP chambers, the bulb was contained within the coolant-wetted region of the lamphead, and it was believed that most of the energy was conducted away from the bulb laterally (radially) through the quartz pieces, gas gaps, and lamphead steel tube into the coolant. In this scenario for the processes for which the tool was used, it was thought that little heat flowed from the bulb/coil past the seal area through the potting and then laterally to the coolant. The use of readily available lower thermal conductivity potting materials was not a problem. In current generations of RTP chambers, higher process temperatures are demanded and the bulb extends beyond the coolant-wetted region of the lamphead, so improved axial heat transport is beneficial.

In the embodiment shown, the sleeve 24 has a circular cross-section which provides ease of manufacture. However, as discussed further below other cross-sectional shapes are possible, including square, rectangular, triangular and multi-arcuate shapes. In one or more embodiments, the cross-sectional shape of the sleeve 24 substantially conforms to the shape of the lamp base. The sleeve 24 has a longitudinal axis 44 parallel to the containing walls 28 and perpendicular to the cross-section of the sleeve 24.

The lamp assembly 120 shown comprises a lamp element 48 seated in the first end 32 of the sleeve or body 24. Generally, the lamp element 48 comprises a light transmissive bulb or envelope 52 that contains an internal atmosphere about a filament 56. The envelope 52 may comprise a variety of shapes, including tubular, conical, spherical, and multi-arcuate shapes. The bulb or envelope 52 also comprises a pinch seal end or lamp base 60 that allows electrical connectors 64 to pass therethrough, and may also comprise an evacuation tube (not shown) used to remove or add gases to the envelope during manufacture which is subsequently sealed. The bulb or envelope 52 comprises quartz, silica glass, aluminosilicate glass or other suitably light-transmissive materials. The internal atmosphere contained in the envelope 52 comprises, for example, a halogen containing gas. The envelope 52 and lamp base are made to withstand high temperatures and rapid temperature changes associated with semiconductor substrate rapid thermal process chambers. For example, the lamp assembly should be able to withstand the local environment resulting from processing wafers to temperatures up to at least about 1100° C., and as high as about 1350° C. and temperature changes of about 300° C./second.

The radiation generating filament 56, which is shown in the form of a coil, inside the envelope 52 of the lamp element 48 has two ends 68a,b which are electrically coupled to the electrical connectors 64. The filament 56 comprises a resistive metal wire, and in one version is a tungsten wire. The filament 56 can have single or multiple coils or coiled coils including overwound coils, or can comprise planar strips, corrugated planar strips or overwound planar strips and is coupled at its midpoints or endpoints 68a,b to the lamp element electrical connectors 64. The electrical properties of the filament 56 can be tuned by adjusting parameters such as its weight per unit length, diameter, and coiling parameters. In operation, the filament 56 can produce radiation at a wattage range of, for example, up to about 1 kW with operating voltages of about 120 $V_{AC,rms}$. Typically, the radiation is in the deep ultraviolet, ultraviolet, visible, infrared, or near infrared ranges.

The lamp element electrical connectors 64 supply power to the filament 56 from a power source outside the lamp element envelope 52 and form a continuous electrical connection between the filament 56 and a power source. The lamp element electrical connectors 64 typically comprise metal wires 72 or foils 76, or some combination thereof, with good electrical conductivity, such as molybdenum wires. The connectors 64 may also comprise other metals, such as tungsten, nickel plated steel, or any other metal with a low electrical resistance and the ability to reliably carry high currents.

The pinch seal end or lamp base 60 of the envelope 52 comprises the region where the envelope 52 is physically constricted about the electrical connectors 64 of the lamp element 48. The connectors 64 pass through and are held in place by the pinch seal end or lamp base 60 as they enter into the envelope 52 to electrically couple an external power source to the filament 56. The pinch seal end or lamp base 60 forms a hermetic seal to maintain the pressure and composition of the internal atmosphere of the envelope 52. The lamp element 48 is at least partially seated in the first end 32 of the sleeve or body 24.

The lamp assembly 120 also comprises one or more transmission wires 80 to transmit power to the lamp element 48 from the second end 36 of the lamp assembly 120. In one embodiment, the lamp assembly 120 comprises a pair of transmission wires 80, each connected to one of a pair of the electrical connectors 64 of the lamp element 48. The transmission wires 80 comprise electrically conductive wires having a relatively low electrical resistance. In one embodiment, the electrical resistance of the transmission wires 80 is no greater than about 0.1 ohms. The transmission wires 80 are electrically connected at one end to the electrical connectors 64 of the lamp element 48 by a soldered connection, a welded connection, a physical abrasion, a sonic coupling, or other type of connection in which a stable, relatively low resistance electrical connection is established. The transmission wires 80 also have an elasticity to allow for their movement and bending. For example, in one version, the transmission wires 80 have a Young's Modulus of about 30 GPa to about 130 GPa. This allows the transmission wires 80 to bend and be manipulated during assembly and operation of the lamp assembly, but also allows them to retain a sufficient amount of rigidity to hold their shape.

The lamp assembly 120 comprises a potting compound 84 inside the sleeve or body 24 which promotes heat transfer between the heat generating elements of the lamp assembly 120 and the sleeve or body 24. The heat generating elements can include, for example, the lamp element 48 and the transmission wires 80. The potting compound 84 transfers heat energy to the sleeve or body 24 which can then transfer the heat out of the lamp assembly 120. In one embodiment, the potting compound 84 is at least between the pinch seal end or lamp base 60 of the lamp element 48 and the containing wall 28 of the sleeve or body 24. For example, the potting compound 84 can be substantially about the entire pinch seal end or lamp base 60 and extend all the way to the containing wall 28. The potting compound 84 can also extend beyond the pinch seal end or lamp base 60 of the lamp element 48, for example, in one embodiment, the potting compound 84 extends towards the second end 36 of the sleeve or body 24. As referred to above, higher conductivity potting compounds, for example, potting compounds having a thermal conductivity exceeding 100 W/(m-K), particularly, exceeding 150 W/(m-K), and more particularly, exceeding 200 W/(m-K) are used in accordance with embodiments of the invention. A particularly suitable compound is a potting compound in which aluminum nitride is the major constituent of the potting compound. An example of a suitable potting compound is Ceramacast product number 675 available from Aremco. Other suitable potting compounds may include alumina filled potting compounds or epoxy based potting compounds.

In one embodiment, a thin layer of a lower thermal conductivity potting compound having a higher reflectivity than the high thermal conductivity potting compound is used to surround the lamp bulb to improve heat reflectivity away from the lamp bulb. For example, a layer of at least about 1 mm in thickness of a zircon based potting compound having a thermal conductivity of 1-2 W/(m-K) can be used around the bulb adjacent lamp base 60, and the remainder of the tube can be filled with the higher conductivity compound.

As is known in the art, for hydraulic setting potting compounds, the potting compound 84 is heated during manufacture of the lamp assembly 120 to remove or reduce its water content. For example, in one embodiment, after heating, the potting compound 84 comprises a water content of no more than 0.1% by weight. The remaining water content is generally releasable during lamp operation. The potting compound 84 is also sufficiently malleable to facilitate its integration into the lamp assembly 120 in thermally continuous regions.

The lamp assembly 120 comprises a plug 88 positioned at the second end 36 of the sleeve or body 24. The plug makes connection with the external power supply and accommodates any misalignment between the lamphead and the external electrical connectors. The plug 88 may be made of rigid material or elastomeric material. Furthermore, the plug may be fixed with respect or inserted into to the end 36 of the sleeve or body 24 as shown, or it may be flexibly position with respect to the end 36. When the plug 88 is flexibly positioned, the plug is capable of movement relative to the second end 36 of the sleeve or body 24 in a direction perpendicular to the longitudinal axis 44. While flexibly positioning the plug 88 may have certain advantages, for ease of manufacturing, it may be desirable to fix an elastomeric plug 88 to the end 36 of the sleeve or body 24. The plug 88 has electrical connectors 92 which transfer electrical power to the transmission wires 80. The plug 88 comprises materials that can withstand the temperatures required to remove water content from the potting compound 84. In one embodiment, the plug material is capable of withstanding exposure to at least about 165° C. for at least about 15 hours. The plug may be made of rigid materials or flexible materials. Rigid materials typically allow for exposure of the plug 88 to higher temperatures for a longer time than flexible materials. While flexible materials, such as elastomers, for example, generally do not withstand exposure to relatively high temperatures as well as rigid materials because the weaker internal bonding required for flexibility also generally results in lower thermal stability, but they may be used in accordance with embodiments of the invention. For example, Santoprene 201-64, an elastomer material used in flexible plugs, can withstand about 150° C. for about 15 hours before its flexibility and other properties begin to degrade. Another elastomer which can be used in flexible plugs is platinum catalyzed silicone which can withstand temperatures over 180° C. for 15 hours, such as GE LIM 9070.

The plug 88 can also comprises a pair of electrical connectors 92 that are shaped to mate with the receiving receptacle in the substrate processing chamber and are electrically connected to the transmission wires 80. The electrical connectors 92 transfer power from the receptacle to the transmission wires 80, which in turn transfer power to the lamp element 48. The plug electrical connectors 92 comprise an electrically conductive material such as a metal. For example, in one version the connectors 92 comprise iron alloys, nickel, or copper, or mixtures thereof. In one version, the connectors 92 may comprise a combination of materials in which one material is plated or deposited onto another material.

The plug 88 comprises a first plug element 104 which provides a structural basis for holding the plug electrical connectors 92 and receiving the lamp assembly transmission wires 80. The first plug element 104 is not shown as directly attached to the body 24 of the lamp assembly 120, but in one or more embodiments, the plug may be attached to the sleeve or body 24. The first plug element 104 has a main body 108 to receive and at least partially encapsulate the plug electrical connectors 92 and the transmission wires 80. The plug element 104 may also have extensions 112 that further support plug electrical connectors 92 that may be relatively large in size as well as provide additional insulation for high voltage operation. Other variations on the shape and size of the first plug element 104 are also possible.

Figure 3:
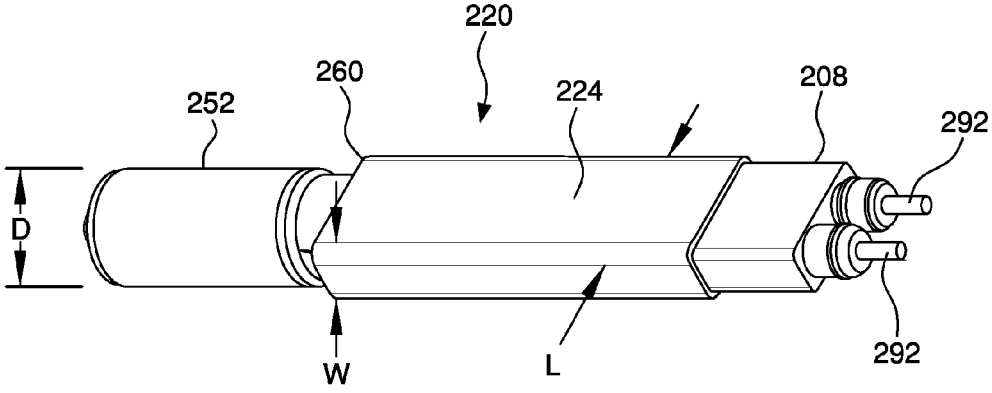
FIG. 3 shows a perspective view of a lamp assembly according to an embodiment of the invention.

Referring now to FIG. 3, a perspective view of a lamp assembly 220 is shown, in which sleeve 224 is substantially rectangular in cross-sectional shape, which conforms the cross-sectional shape of the lamp base 260 and plug 208, which has connectors 292 extending therefrom. The bulb or envelope 252 is substantially circular in cross-section. As is understood in the art, the lamp assembly 220 may be inserted into a water or other fluid cooled stainless steel housing, which cools the lamp assembly. As discussed above, by adjusting one or more of the sleeve wall thickness, thermal conductivity of the sleeve and the thermal conductivity of the potting compound, heat transfer to the cooling fluid can be improved resulting in improved bulb life.

Reference throughout this specification to "one embodiment," "certain embodiments," "one or more embodiments" or "an embodiment" means that a particular feature, structure, material, or characteristic described in connection with the embodiment is included in at least one embodiment of the invention. Thus, the appearances of the phrases such as "in one or more embodiments," "in certain embodiments," "in one embodiment" or "in an embodiment" in various places throughout this specification are not necessarily referring to the same embodiment of the invention. Furthermore, the particular features, structures, materials, or characteristics may be combined in any suitable manner in one or more embodiments.

It is to be understood that the above description is intended to be illustrative, and not restrictive. Many other embodiments will be apparent to those of ordinary skill in the art upon reviewing the above description. The scope of the invention should, therefore, be determined with reference to the appended claims, along with the full scope of equivalents to which such claims are entitled.

The invention claimed is:

1. A lamp assembly comprising:

a bulb enclosing at least one radiation generating filament attached to a pair of leads, the bulb having an inner surface an outer surface;

a lamp base configured to receive the pair of leads;

a metal sleeve surrounding the lamp base and filled with a potting compound, the sleeve having a wall thickness of at least about 0.013 inches and the potting compound having a thermal conductivity exceeding about 100 W/(K-m), the lamp assembly adapted for use in a substrate processing chamber to heat the substrate to temperatures up to at least about 1100° C.

2. The lamp assembly of claim 1, wherein the potting compound has a thermal conductivity exceeding about 150 W/(K-m).

3. The lamp assembly of claim 1, wherein the potting compound has a thermal conductivity exceeding about 200 W/(K-m).

4. The lamp assembly of claim 2, wherein the wall thickness of the sleeve exceeds about 0.040 inches.

5. The lamp assembly of claim 3, wherein the wall thickness of the sleeve exceeds about 0.050 inches.

6. The lamp assembly of claim 1, wherein sleeve is made from copper or aluminum.

7. The lamp assembly of claim 1, wherein the potting compound comprises magnesium phosphate bonded aluminum nitride.

8. The lamp assembly of claim 1, wherein potting compound comprises an epoxy based potting compound.

9. The lamp assembly of claim 8, wherein the epoxy based potting compound further comprises copper or silver.

10. The lamp assembly of claim 1, wherein the cross-sectional shape of the sleeve substantially conforms to the cross-sectional shape of the lamp base.

11. The lamp assembly of claim 10, wherein the cross-sectional shape of the sleeve is substantially rectangular.

12. A lamp assembly comprising:

a bulb enclosing at least one radiation generating filament attached to a pair of leads, the bulb having an inner surface an outer surface;

a lamp base configured to receive the pair of leads;

a first potting compound having a thermal conductivity exceeding about 100 W/(K-m) surrounding the base, the lamp assembly adapted for use in a substrate processing chamber to heat the substrate to temperatures up to at least about 1100° C.

13. The lamp assembly of claim 12, wherein the thermal conductivity of the potting compound exceeds about 150 W/(K-m).

14. The lamp assembly of claim 12, wherein the thermal conductivity of the potting compound exceeds about 200 W/(K-m).

15. The lamp assembly of claim 12, further comprising a copper or aluminum sleeve surrounding the potting compound.

16. The lamp assembly of claim 15, further comprising a second potting compound located adjacent the bulb, the second potting compound having a lower thermal conductivity and a higher reflectivity than the first potting compound.

17. The lamp assembly of claim 16, wherein the first potting compound comprises an epoxy based aluminum nitride compound and the second potting compound comprises a zirconia based potting compound.

18. The lamp assembly of claim 16, wherein the second potting compound is present in a layer having a thickness of less than about 1 mm.

19. The lamp assembly of claim 15, wherein the metal sleeve has a wall thickness of at least about 0.020 inches.

20. The lamp assembly of claim 16, wherein the metal sleeve has a wall thickness of at least about 0.040 inches.

*21. A rapid thermal processing lamp assembly comprising:*

*a sleeve having a longitudinal axis, a first end, and a second end extending from the first end; and*

*a lamp element including a bulb enclosing at least one radiation generating filament attached to a pair of leads, the bulb having an inner surface, an outer surface, and a lamp base configured to receive the pair of leads, the lamp element adapted for use in a substrate processing chamber to heat the substrate to temperatures of 1100° C., and the first end of the sleeve surrounding at least a portion the lamp base, and a potting compound optionally inside the sleeve, the sleeve having a wall with a thickness of at least about 0.013 inches and being made from material selected from copper and aluminum.*

*22. The lamp assembly of claim 21 wherein the sleeve is copper.*

*23. The lamp assembly of claim 21, wherein the sleeve is aluminum.*

*24. The lamp assembly of claim 21, wherein the sleeve comprises a tube having little or no potting compound contained within the tube.*

*25. The lamp assembly of claim 24, wherein the tube is substantially a solid with conduits provided for wires.*

*26. The lamp assembly of claim 22, wherein the sleeve has a wall with a thickness of at least about 0.020 inches.*

*27. The lamp assembly of claim 22, wherein the sleeve has a wall thickness of at least about 0.040 inches.*

*28. The lamp assembly of claim 23, wherein the sleeve has a wall with a thickness of at least about 0.020 inches.*

*29. The lamp assembly of claim 23, wherein the sleeve has a wall thickness of at least about 0.040 inches.*

*30. The lamp assembly of claim 21, wherein the sleeve contains potting compound.*

* * * * *